US010003333B2

(12) United States Patent
LaFountain et al.

(10) Patent No.: US 10,003,333 B2
(45) Date of Patent: Jun. 19, 2018

(54) METHOD OF MANUFACTURING AN ENCLOSED PROXIMITY SWITCH ASSEMBLY

(71) Applicant: General Equipment and Manufacturing Company, Inc., Louisville, KY (US)

(72) Inventors: Robert Lynn LaFountain, Charlestown, IN (US); Gregory Curtis Merrifield, Prospect, KY (US); Michael Simmons, Louisville, KY (US); Brian Phillip Pate, Fredericksburg, IN (US)

(73) Assignee: General Equipment and Manufacturing Company, Inc., Louisville, KY (US)

( * ) Notice: Subject to any disclaimer, the term of this patent is extended or adjusted under 35 U.S.C. 154(b) by 688 days.

(21) Appl. No.: 14/495,721

(22) Filed: Sep. 24, 2014

(65) Prior Publication Data
US 2015/0007431 A1  Jan. 8, 2015

Related U.S. Application Data

(62) Division of application No. 13/730,351, filed on Dec. 28, 2012, now Pat. No. 8,866,571.
(Continued)

(51) Int. Cl.
*H03K 17/95*   (2006.01)
*G01R 33/00*   (2006.01)
(Continued)

(52) U.S. Cl.
CPC ..... *H03K 17/9505* (2013.01); *G01R 33/0047* (2013.01); *G01R 33/0052* (2013.01);
(Continued)

(58) Field of Classification Search
CPC .......... H03K 17/9502; H03K 17/9505; G01R 33/0047; G01R 33/0052; H01H 19/06; Y10T 29/49105
See application file for complete search history.

(56) References Cited

U.S. PATENT DOCUMENTS 2,952,802 A * 9/1960 Michelson ............... G21C 7/12
                                                    335/281
3,119,274 A * 1/1964 Short .................. B25D 11/106
                                                    173/48
(Continued)

FOREIGN PATENT DOCUMENTS

CN      202259008 U    5/2012
GB      2 265 204 A    9/1993
WO      WO-2012/148970 A1  11/2012

OTHER PUBLICATIONS

International Search Report and Written Opinion for Application No. PCT/US2012/070791, dated Mar. 15, 2013.
(Continued)

*Primary Examiner* — Peter DungBa Vo
*Assistant Examiner* — Jeffrey Carley
(74) *Attorney, Agent, or Firm* — Marshall, Gerstein & Borun LLP

(57) ABSTRACT

A method of non-rotatably securing a target to a shaft extending along a longitudinal axis within an enclosed proximity switch assembly is described. The target support at least one target magnet and a hub having a body portion extending along the longitudinal axis. The body portion includes an outer surface and a shaft aperture extending along the longitudinal axis, and further includes at least one threaded body aperture extending from the outer surface to the shaft aperture. The shaft is inserted into the shaft aperture, and a set screw is inserted into one of the body apertures. A torque is applied to the set screw to threadably engage the set screw with the one of the body apertures such that a distal end of the set screw contacts an outer surface of the shaft. The set screw is sealed within the body aperture with a high-temperature potting.

9 Claims, 7 Drawing Sheets

Related U.S. Application Data

(60) Provisional application No. 61/580,984, filed on Dec. 28, 2011.

(51) Int. Cl.
    *H05K 5/02*     (2006.01)
    *H01H 19/06*     (2006.01)
    *H01H 36/00*     (2006.01)

(52) U.S. Cl.
    CPC ............ *H01H 19/06* (2013.01); *H01H 36/00* (2013.01); *H05K 5/0247* (2013.01); *Y10T 29/49105* (2015.01); *Y10T 29/49963* (2015.01)

(56) References Cited

U.S. PATENT DOCUMENTS

| | | | |
|---|---|---|---|
| 3,822,390 A * | 7/1974 | Janson | B65H 59/04 |
| | | | 310/104 |
| 4,405,826 A | 9/1983 | Reichert et al. | |
| 5,223,822 A | 6/1993 | Stommes et al. | |

OTHER PUBLICATIONS

International Preliminary Report on Patentability for International Application No. PCT/US2012/070791, dated Jul. 10, 2014.
Office Action for Chinese Patent Application No. 201210599231.X, dated Nov. 4, 2015.
Office Action for Chinese Patent Application No. 201210599231.X, dated Jul. 13, 2016.

\* cited by examiner

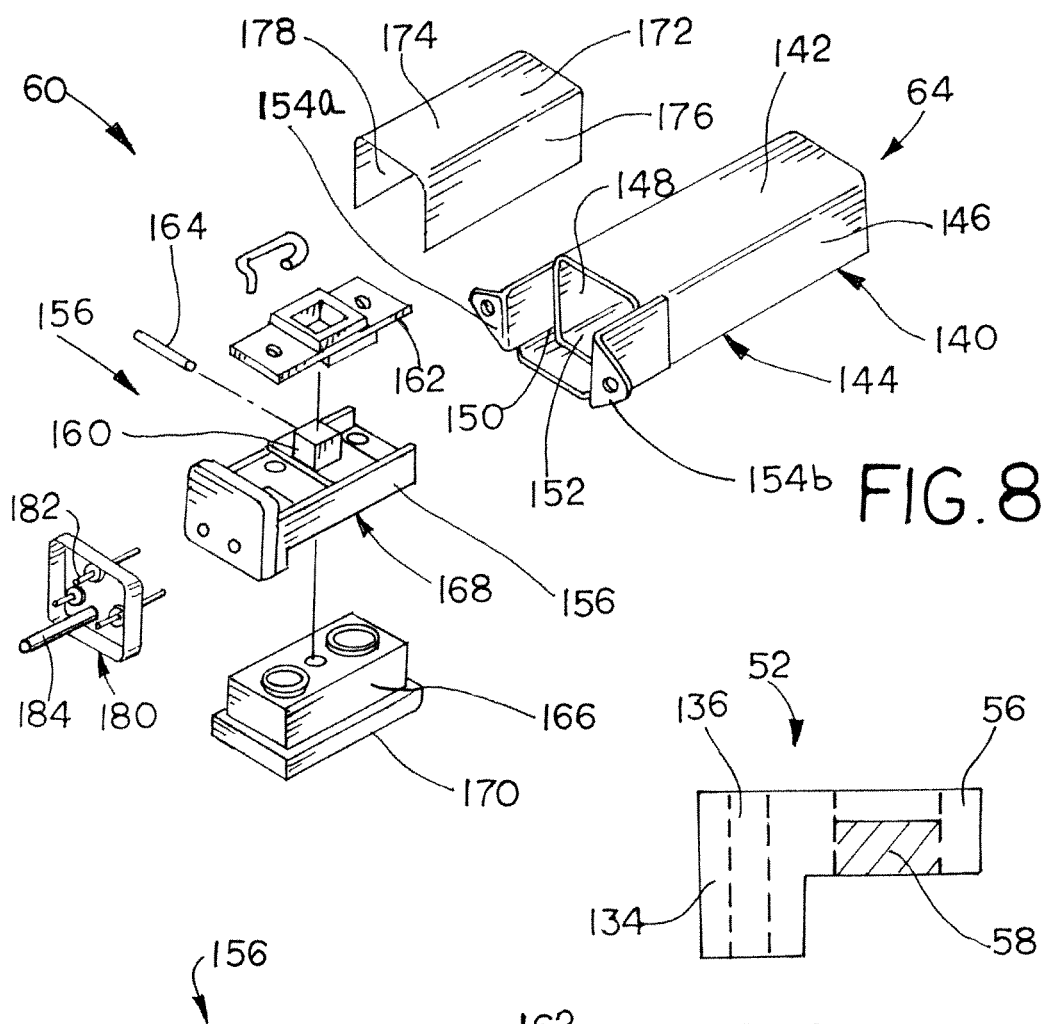
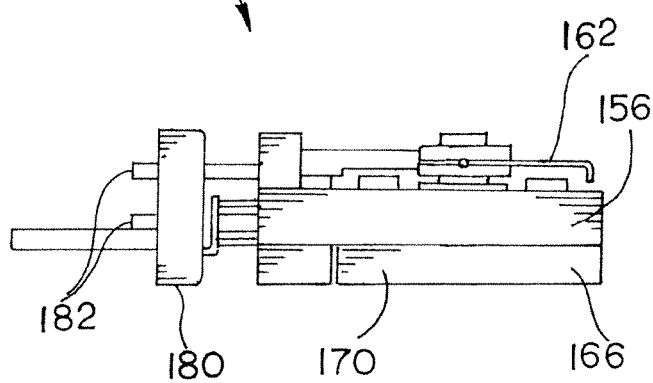

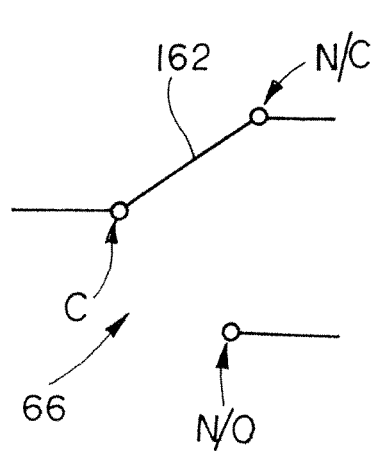
FIG.10A
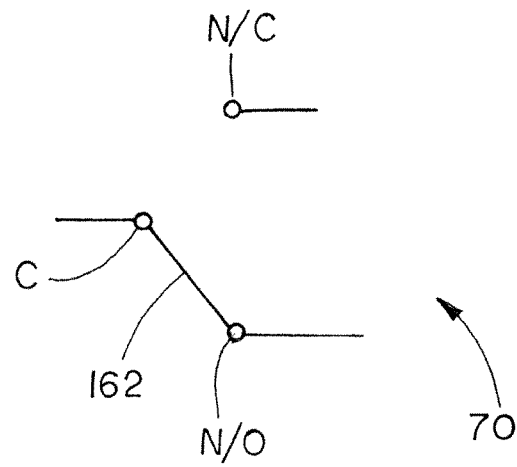
FIG.10B
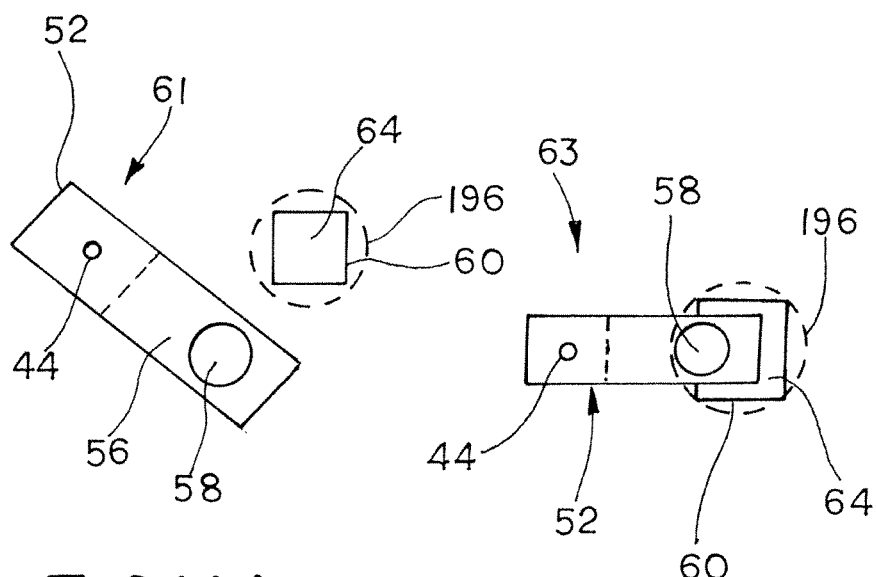
FIG.11A
FIG.11B

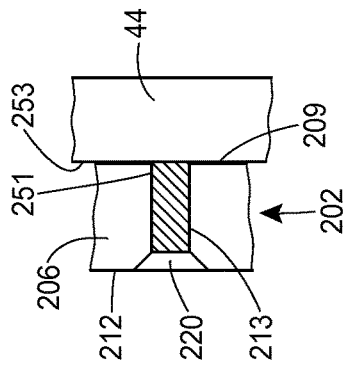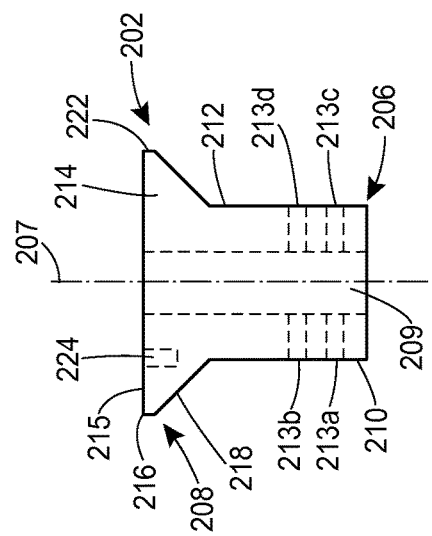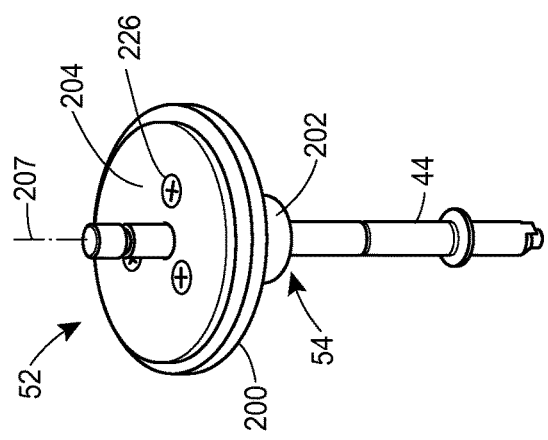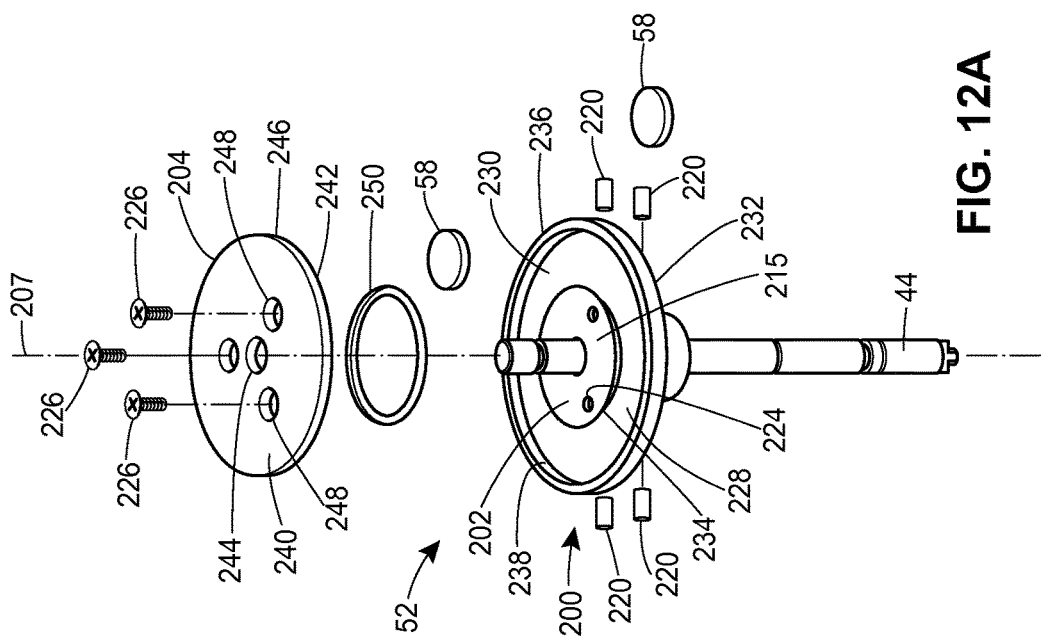

METHOD OF MANUFACTURING AN ENCLOSED PROXIMITY SWITCH ASSEMBLY

CROSS-REFERENCE TO RELATED APPLICATIONS

This application claims priority to and the benefit of the filing date of (1) U.S. application Ser. No. 13/730,351 filed on Dec. 28, 2012 and entitled "Enclosed Proximity Switch Assembly," and (2) provisional U.S. Application Ser. No. 61/580,984 filed on Dec. 28, 2011 and entitled "Enclosed Proximity Switch Assembly," the entire disclosures of which are incorporated herein by reference.

FIELD OF THE DISCLOSURE

This disclosure relates generally to an enclosure, and, more particularly, to a sealed enclosure containing at least one magnetic target that is detected by at least one magnetic proximity switch.

BACKGROUND

Magnetic proximity switches, also known as limit switches, are commonly used for position sensing. Typically, a magnetic proximity switch assembly includes a target and a proximity switch, with the proximity switch including a switching circuit. The switching circuit may include an element, such as a lever, that is biased in a first position by a permanent magnet contained in the housing of the proximity switch. With the lever in this first position, the proximity switch is maintained in a first state, in which, for example, a normally closed contact makes contact with a common contact. When the target, which generally includes a permanent magnet, passes within a predetermined range of the proximity switch, the magnetic flux generated by the target magnet causes the lever of the switching circuit to change bias from the first state to a second state, in which, for example, a normally open contact makes contact with the common contact.

In some applications, one or more target magnets and one or more proximity switches may be disposed within a sealed enclosure to protect the proximity switches from damage. This configuration is common when the magnetic proximity switch assembly is used in hazardous environments, such as nuclear applications. In such applications, the enclosure is intended to withstand the high temperatures and pressures that occur during a containment accident or a LOCA (loss of coolant accident) at a nuclear facility. Typically, a shaft vertically disposed within the enclosure supports the target magnet as the target magnet rotates with the shaft relative to a stationary proximity switch. Typically, a top portion of the shaft is coupled to a sealed top bearing assembly disposed within a top aperture that extends through a top portion of the enclosure, and a bottom portion of the shaft is received in a bottom aperture that extends through a bottom portion of the enclosure. The bottom portion of the shaft that extends through the bottom aperture is typically coupled to a valve element, such as the rotating stem of a control valve used for a nuclear application, and the rotation of the stem can be detected with the valve rotates the target magnet within a predetermined range of the proximity switch disposed within the enclosure, thereby indicating the control valve is in a particular position. Alternatively, the rotating stem of the control valve may move the target magnet out of a predetermined range of the proximity switch, thereby indicating the control valve has moved from a particular position.

Due to the hazardous environments in which the magnetic proximity switch assembly is used, the enclosure must be sealed to avoid allowing high temperature gas under high pressure, or other contaminants, into the enclosure. Moreover, due to loads that may occur during a seismic event, components such as the proximity switch and/or an assembly that secures the target magnet to the shaft must be adequately secured within the enclosure to prevent unintended displacement that may occur as a result of the seismic loads.

BRIEF SUMMARY OF THE DISCLOSURE

In accordance with one exemplary aspect of the present invention, a target support for supporting a target magnet within an enclosed proximity switch assembly includes a hub having a body portion that extends along a longitudinal axis, the body portion including an outer surface and a shaft aperture that extends along the longitudinal axis. The shaft aperture is adapted to receive a portion of a shaft that extends along the longitudinal axis, and the body portion further includes one or more threaded body apertures that extend from the outer surface to the shaft aperture. The target support further includes a magnet support non-rotatably secured to the hub, the magnet support having a base portion that extends in a direction normal to the longitudinal axis, and the base portion includes a planar top surface. A side wall upwardly extends from the top surface of the base portion, and the side wall is partially defined by an inner surface. The target support also includes one or more target magnets disposed on the top surface of the base portion of the magnet support between a portion of the hub and the inner surface of the side wall of the magnet support. In addition, the target support includes a clamp plate, and the clamp plate has a planar bottom surface and a shaft aperture adapted to receive a portion of the shaft, and the clamp plate is secured to the hub such that the bottom surface of the clamp plate is immediately adjacent to or in contact with a top surface of the hub and such that the bottom surface of the clamp plate is also immediately adjacent to or in contact with a top surface of the one or more target magnets. The target support also includes a set screw adapted to threadably engage one of the one or more body apertures such that a distal end of the set screw contacts an outer surface of the shaft to non-rotatably secure the target support to the shaft. A minimum torque of 150 inch-ounces is applied to the set screw, and the set screw is sealed within the one of the one or more body apertures with a high-temperature potting.

BRIEF DESCRIPTION OF THE DRAWINGS

FIG. 7B is a side view of the target support of the embodiment of the enclosed proximity switch assembly of FIG. 1;

FIG. 8 is an exploded perspective view of a proximity switch of the embodiment of the enclosed proximity switch assembly illustrated in FIG. 1;

FIG. 9 is an side view of a switch assembly of the proximity switch of FIG. 8;

FIG. 10A is a schematic view of the proximity switch of FIG. 8 in a first state;

FIG. 10B is a schematic view of the proximity switch of FIG. 8 in a second state;

FIG. 11A is a top view of the target magnet and the proximity switch in a first shaft position;

FIG. 11B is a top view of the target magnet and the proximity switch in a second shaft position;

FIG. 12A is an exploded perspective view of an embodiment of a target support;

FIG. 12B is a perspective view of the embodiment of the target support of FIG. 12A;

FIG. 13A is front view of a hub of the target support of FIG. 12A;

FIG. 13B is partial sectional front view of a set screw in a body aperture of the hub of FIG. 13A.

DETAILED DESCRIPTION

Figure 3:
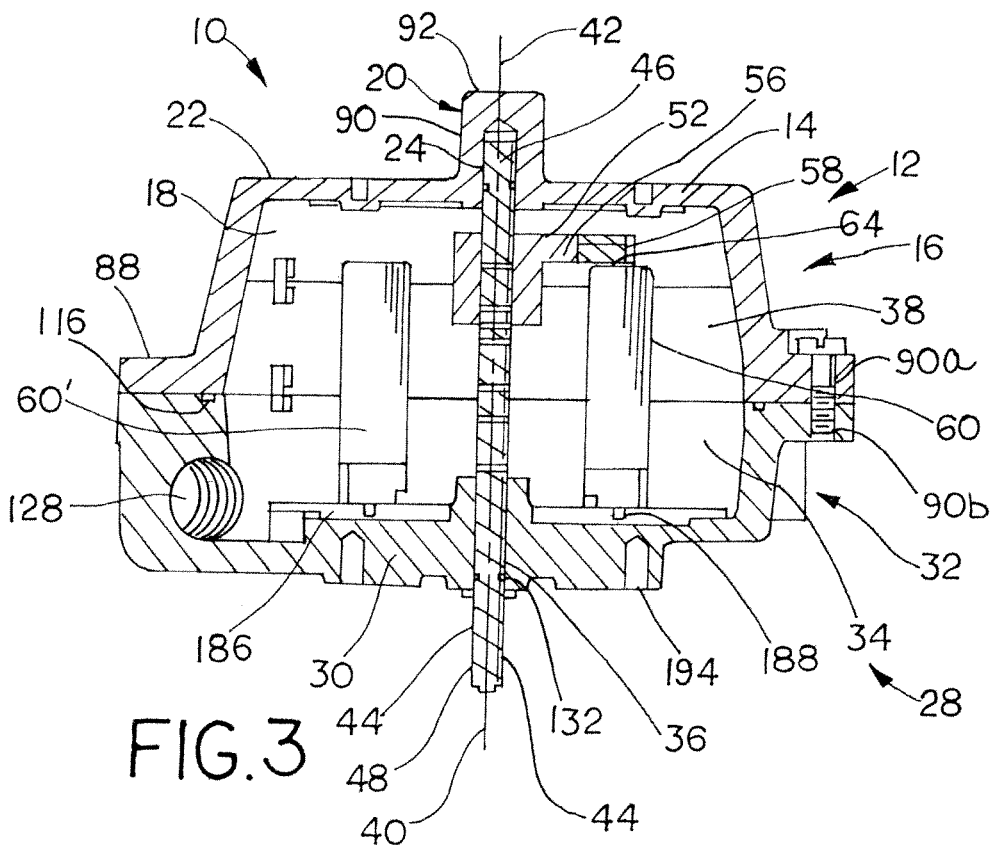
FIG. 3 is a sectional side view of the enclosed proximity switch assembly taken along section line 3-3 of FIG. 2.
Figure 4:
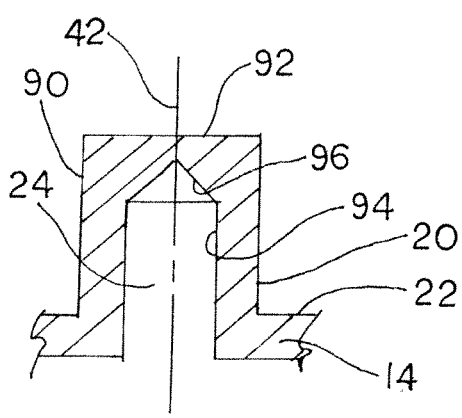
FIG. 4 is a side view of the shaft protrusion of FIG. 3 with the shaft omitted for clarity.

As illustrated in FIG. 3, an enclosed proximity switch assembly 10 includes a top enclosure 12 having a base wall 14 and a plurality of side walls 16 that extend downwardly from the base wall 14, and the base wall 14 and the plurality of side walls 16 may at least partially define a first volume 18. A shaft protrusion 20 may upwardly extend from a top surface 22 of the base wall 14, and an interior bore portion 24 may be defined within the shaft protrusion 20 such that the interior bore portion 24 forms a portion of the first volume 18. The interior bore portion 24 may define an enclosed volume. The proximity switch assembly 10 also includes a bottom enclosure 28 having a base wall 30 and a plurality of side walls 32 that extend upwardly from the base wall 30, and the base wall 30 and the plurality of side walls 32 at least partially define a second volume 34. A shaft aperture 36 may be defined in the base wall 30, the shaft aperture 36 may extend through the base wall 30. The top enclosure 12 may be coupled to the bottom enclosure 28 such that the first volume 18 and the second volume 34 cooperate to define an interior volume 38. So configured, a longitudinal axis 40 of the shaft aperture 36 may be aligned with a longitudinal axis 42 of the interior bore portion 24. The proximity switch assembly 10 also includes a shaft 44 having a first end 46, a second end 48 opposite the first end 46, and a first intermediate portion 50 between the first end 46 and the second end 48, wherein the first end 46 of the shaft is disposed within the interior bore portion 24 formed in the shaft protrusion 20 of the top enclosure 12. The first intermediate portion 50 of the shaft 44 may extend through the shaft aperture 36 formed in the bottom enclosure, and the second end of the shaft may be disposed exterior to the interior volume 38. The shaft 44 is rotatable relative to the top enclosure 12 and the bottom enclosure 28. In addition, the proximity switch assembly 10 includes a target support 52 non-rotatably coupled to a second intermediate portion 54 of the shaft 44, the second intermediate portion 54 being disposed between the first intermediate portion 50 and the first end 46 of the shaft 44. The target support 52 including a radial portion 56 that extends away from the shaft, and a target magnet 58 may be coupled to the radial portion 56 of the target support 52. As illustrated in FIGS. 3 and 8 to 11B, the proximity switch assembly 10 includes at least one proximity switch 60 disposed within the interior volume 38 and coupled to the bottom enclosure 28 such that when the shaft 44 is in a first shaft position 61, the target magnet 58 is disposed a distance away from a top portion 64 of the at least one proximity switch 60, thereby causing the proximity switch 60 to be in a first state 66. When the shaft 44 is rotated into a second shaft position 63, the target magnet 58 is disposed adjacent to the top portion 64 of the at least one proximity switch 60, thereby causing the proximity switch to be in a second state 70. Each of the first and second states 66, 70 may correspond to a position of a valve element that is coupled to the second end 48 of the shaft 44.

As illustrated in FIGS. 1, 2, 3, and 6, the enclosed proximity switch assembly 10 may include a top enclosure 12 that may include a base wall 14. The base wall 14 of the top enclosure 12 may be rectangular in shape and may be substantially planar, and the plane formed by the base wall 14 may be substantially horizontal. As used herein, the term "horizontal" indicates a direction that is substantially coplanar with or substantially parallel to the X-Y plane of the reference coordinate system illustrated in FIG. 1. The term "vertical" indicates a direction that is substantially normal to the X-Y plane (i.e., the direction of the Z axis) of the reference coordinate system illustrated in FIG. 1. Instead of a horizontally disposed base wall 14, the planar base wall 14 may be obliquely disposed relative to the X-Y plane. In addition, rather than the planar configuration illustrated in FIG. 1, the base wall 14 may have any shape suitable for a particular application. For example, the base wall 14 may have a curved cross-sectional shape or may be otherwise contoured, or the base wall 14 may be partially curved/contoured and partially planar. In addition, the base wall 14 may include two or more planar portions that are vertically offset (not shown) to form a stepped surface.

Referring again to FIGS. 1, 2, 3, and 6, the top enclosure 12 may include a plurality of side walls 16 that extend downwardly from the base wall 14. More specifically, the plurality of downwardly extending side walls 16 may include a first wall 72 that extends from a first perimeter edge 74 of the base wall 14. A second wall 76 may extend from a second perimeter edge 78 of the base wall 14, and the second perimeter edge 78 may be disposed opposite from the first perimeter edge 74. A third wall 80 may extend from a third perimeter edge 82 of the base wall 14, and the third perimeter edge 82 may extend between the first and second perimeter edges 74, 78. A fourth wall 84 may extend from a fourth perimeter edge 86 of the base wall 14 that is opposite to the third perimeter edge 82, and the fourth perimeter edge 86 may extend between the first and second perimeter edges 74, 78. Each of the plurality of side walls 16 may extend obliquely away from the base wall 14, as illustrated in FIGS. 1, 2, 3, and 6. However, any or all of the plurality of side walls 16 may extend away from the base wall 14 in any suitable manner or direction, such as perpendicularly, for example. While each of the plurality of side walls 16 is illustrated as planar in FIGS. 1-3, any or all of the plurality of side walls 16 may have any suitable shape, such as contoured, or partially planar or partially contoured. Moreover, the plurality of side walls 16 may include more (or fewer) walls than illustrated in FIGS. 1, 2, 3, and 6. An upper flange 88 may horizontally extend from a bottom portion of each of the plurality of side walls 16, and the upper flange 88 may have a plurality of mating apertures 90a disposed therein, the mating apertures 90a adapted to receive bolts that couple the top enclosure 12 to the bottom enclosure 28. As configured, the base wall 14 and the plurality of downwardly extending side walls 16 may at least partially define a first volume 18.

As illustrated in FIGS. 1, 3, 4, and 6, the top enclosure 12 may include a shaft protrusion 20 that upwardly extends from a top surface 22 of the base wall 14. The shaft protrusion 20 may include an outer surface 90 and the outer surface 90 may have any suitable shape or combination of shapes. For example, the outer surface 90 may have a circular cross-sectional shape such that the outer surface 90 is cylindrical. Alternatively, the outer surface 90 may have the cross-sectional shape of an oval or a polygon, for example. The shaft protrusion 20 may also have a top surface 92, and the top surface 92 may be planar. However, the top surface 92 may have any suitable shape or combination of shapes, such as the shape of a cone or the shape of a hemisphere, for example. An inner side surface 94 may partially define an interior bore portion 24 of the of the shaft protrusion 20, and the interior bore portion 24 may be adapted to receive the first end 46 of the shaft 44 in a manner that allows the shaft 44 to rotate relative to the top enclosure 12. The inner side surface 94 may have any suitable shape or combination of shapes. For example, the inner side surface 94 may have a circular cross-sectional shape such that the inner side surface 94 is cylindrical. The cylindrical inner side surface 94 may have a longitudinal axis 42, and the cylindrical inner side surface 94 may be sized to receive the first end 46 of the shaft 44. The interior bore portion 24 of the shaft protrusion 20 may be further defined by an inner top surface 96, and the inner top surface 96 may have any suitable shape or combination of shapes. For example, the inner top surface 96 may be conical, planar, or hemispherical. As configured, the inner side surface 94 and the inner top surface 96 cooperate to at least partially define an enclosed volume (i.e., the interior bore portion 24) within the shaft protrusion 20 that forms a portion of the first volume 18. Because the interior bore portion 24 is an enclosed volume that is not in fluid communication with the exterior of the top enclosure 12, the interior bore portion 24 forms a blind bore that is adapted to receive the first end 46 of the shaft 44 without providing a potential leakpath between the interior bore portion 24 and the exterior of the top enclosure 12.

Figure 1:
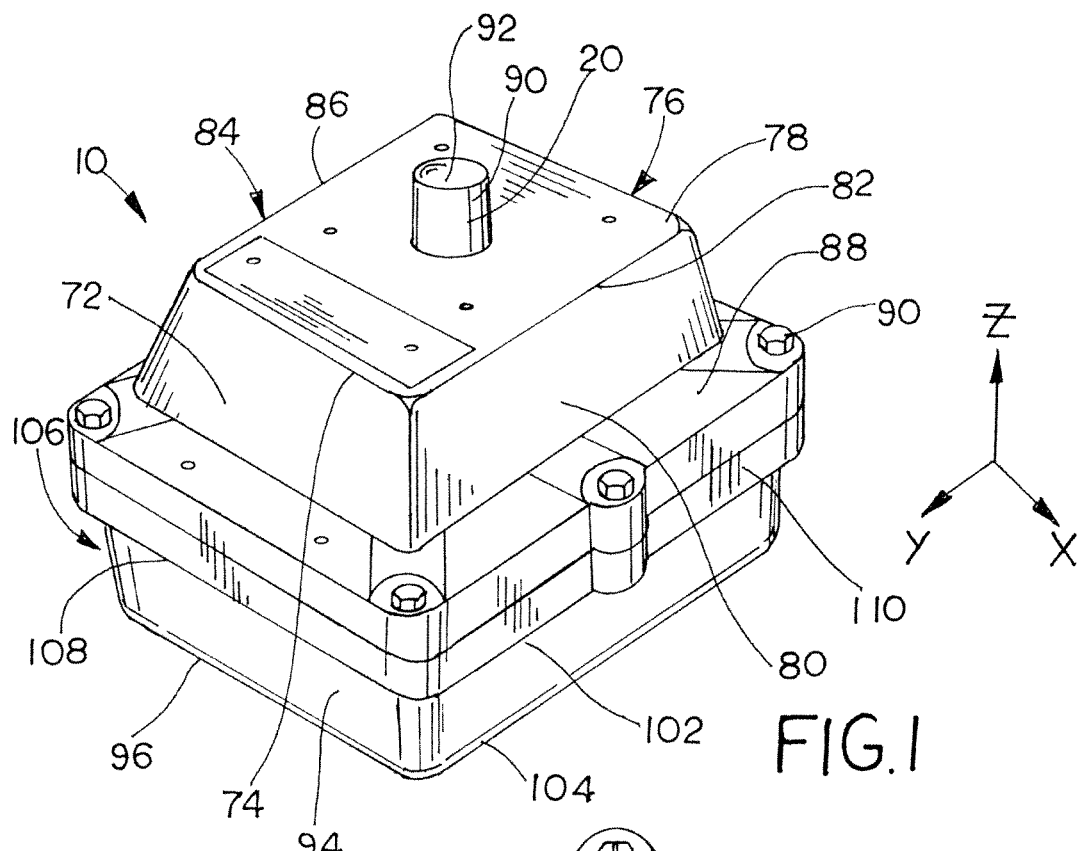
FIG. 1 is a perspective view of the exterior of an embodiment of an enclosed proximity switch assembly.
Figure 2:
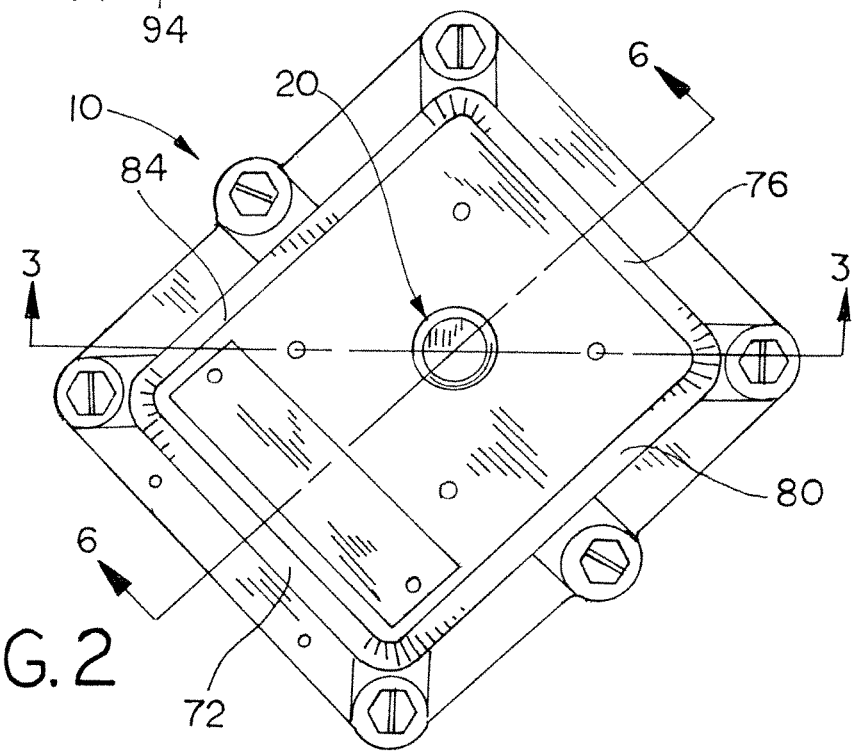
FIG. 2 is a top view of the embodiment of the enclosed proximity switch assembly of FIG. 1.
Figure 6:
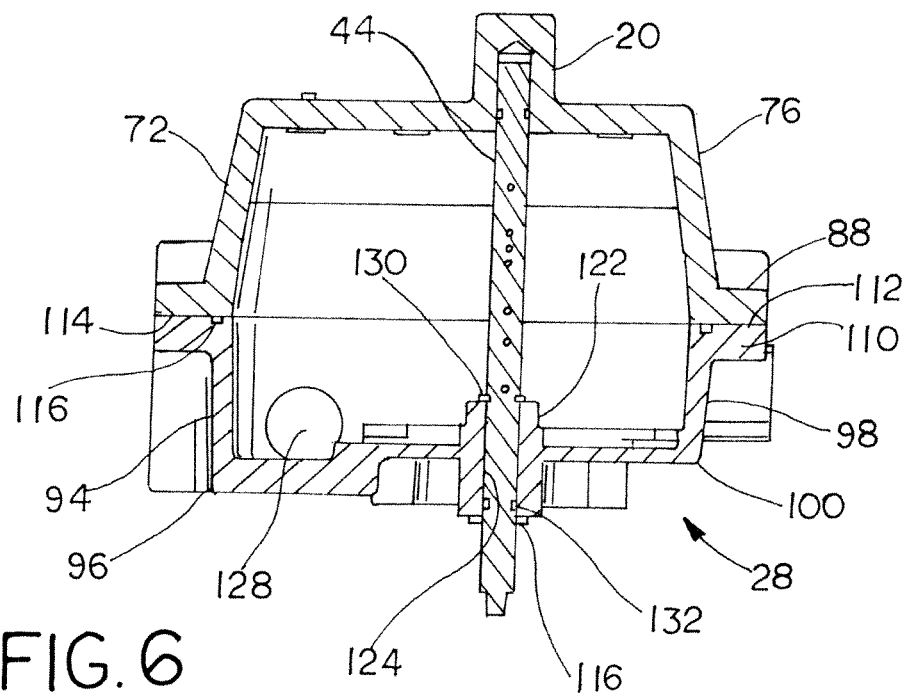
FIG. 6 is a sectional side view of the enclosed proximity switch assembly taken along section line 6-6 of FIG. 2.

As illustrated in FIGS. 1, 3, and 6, the enclosed proximity switch assembly 10 may also include a bottom enclosure 28 that may include a base wall 30. The base wall 30 of the bottom enclosure 28 may be rectangular in shape and may be substantially planar, and the plane formed by the base wall 30 may be substantially horizontal and parallel to the base wall of the 14 of the top enclosure 12. Instead of a horizontally disposed base wall 30, the planar base wall 30 may be obliquely disposed relative to the X-Y reference plane illustrated in FIG. 1. In addition, rather than the planar configuration illustrated in FIG. 1, the base wall 30 may have any shape suitable for a particular application. For example, the base wall 30 may have a curved cross-sectional shape or may be otherwise contoured, or the base wall 30 may be partially curved/contoured and partially planar. In addition, the base wall 30 may include two or more planar portions that are vertically offset (not shown) to form a stepped surface.

Referring again to FIGS. 1, 3, and 6, the bottom enclosure 28 may include a plurality of side walls 32 that extend upwardly from the base wall 30. More specifically, the plurality of upwardly extending side walls 32 may include a first wall 94 that extends from a first perimeter edge 96 of the base wall 30. A second wall 98 may extend from a second perimeter edge 100 of the base wall 30, and the second perimeter edge 100 may be disposed opposite from the first perimeter edge 96. A third wall 102 may extend from a third perimeter edge 104 of the base wall 30, and the third perimeter edge 104 may extend between the first and second perimeter edges 96, 100. A fourth wall 106 may extend from a fourth perimeter edge 108 of the base wall 30 that is opposite to the third perimeter edge 104, and the fourth perimeter edge 108 may extend between the first and second perimeter edges 96, 100. Each of the plurality of side walls 32 may extend obliquely away from the base wall 30, as illustrated in FIGS. 1, 3, and 6. However, any or all of the plurality of side walls 32 may extend away from the base wall 30 in any suitable manner or direction, such as perpendicularly, for example. While each of the plurality of side walls 32 is illustrated as planar in FIGS. 1, 3, and 6, any or all of the plurality of side walls 32 may have any suitable shape, such as contoured, or partially planar or partially contoured. Moreover, the plurality of side walls 32 may include more (or fewer) walls than illustrated in FIGS. 1, 3, and 6. As configured, the base wall 30 and the plurality of downwardly extending side walls 32 may at least partially define a second volume 34.

Referring again to FIGS. 1, 3, and 6, the bottom enclosure 28 may include one or more side apertures 128, and each side aperture 128 may be formed at any appropriate location. For example, a side aperture 128 may extend through one of the plurality of side walls 32, such as through the fourth wall 106. The side aperture 128 may be defined by an interior surface that may be at least partially threaded such that a fitting having a threaded exterior surface can engage the side aperture 128. The side aperture 128 may have any suitable shape. For example, the side aperture 128 may have a circular cross-sectional shape. The side aperture 128 may be sized to receive the fitting of a length of conduit that is adapted to contain a plurality of wires that connects the one or more proximity switches 60 to externally located hardware.

Referring again to FIGS. 1, 3, and 6, the bottom enclosure 28 may include a shaft aperture 36 disposed through the base wall 30. The shaft aperture 38 may be sized to receive a first intermediate portion 50 of the shaft 44. Because the shaft aperture 36 extends through the base wall 30, the second volume 34 is in fluid communication with the exterior of the bottom enclosure 28 when the shaft 44 is not disposed through the shaft aperture 36. The shaft aperture 36 may be partially defined by an inner surface 120 of an upper boss portion 122 that extends upwardly from the base wall 30. In addition, the shaft aperture 36 may be further partially defined by an inner surface 124 of a lower boss portion 122 that extends downwardly from the base wall 30. The inner surface 120 of an upper boss portion 122 and the inner surface 124 of a lower boss portion 122 may each be cylindrical such that the shaft aperture 28 has the overall shape of a cylinder having a longitudinal axis 40. When the top enclosure 12 is coupled to the bottom enclosure as described below, the longitudinal axis 42 of the interior bore portion 24 is axially aligned with the longitudinal axis 40 of the shaft aperture 28.

Referring again to FIGS. 1, 3, and 6, a lower flange 110 may horizontally extend from a top portion of each of the plurality of side walls 32, and the lower flange 110 may have an engagement surface 112 that engages a corresponding engagement surface 114 of the upper flange 88. A seal 116 may be disposed in a recess that extends along the top portion of each of the plurality of side walls 32, and the seal 116 is adapted to prevent a leakpath between the engagement surface 112 of lower flange 110 and the engagement surface 114 of upper flange 88 when the top enclosure 12 is coupled to the bottom enclosure 28. The seal 116 may be made from a radiation tolerant, high temperature silicone material. Instead of the seal 116 in a recess, any sealing arrangement may be used. For example, a gasket may be disposed between the engagement surface 112 of lower flange 110 and the engagement surface 114 of upper flange 88.

The top enclosure 12 may be coupled to the bottom enclosure 28 by any means known in the art. For example, the lower flange 110 may have a plurality of mating apertures 90b disposed therein, the mating apertures 90b being coaxially aligned with the mating apertures 90a of the upper flange 88 such that each pair of mating apertures 90a, 90b may receive a bolt 118 adapted to couple the top enclosure 12 to the bottom enclosure 28. The bolt 118 may have a threaded bottom portion, and the threaded bottom portion of the bolt may engage a threaded interior portion of one or both of the mating apertures 90a, 90b. Assembled as described, the base wall 30 and the plurality of downwardly extending side walls 32 may at least partially define a second volume 34, and when the top enclosure 12 is secured to the bottom enclosure 28, the first volume 18 and the second volume 34 form an interior volume 38.

The top enclosure 12 and the bottom enclosure 28 may be manufactured from any suitable materials. For example, the top enclosure 12 and the bottom enclosure 28 may be formed from a metal or a metal alloy, such as aluminum or 316 stainless steel. The metal or metal alloy enclosures 12, 28 may be formed by any process or combination of processes, such as by casting or machining. Alternatively, the top enclosure 12 and the bottom enclosure 28 may be made of plastic, and the enclosures 12, 28 may be formed from an injection molding process.

Figure 5:
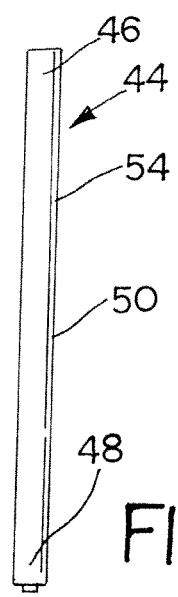
FIG. 5 is a side view of a shaft of the embodiment of the enclosed proximity switch assembly of FIG. 1.

As illustrated in FIGS. 3, 5, and 6, the enclosed proximity switch assembly 10 may also include a shaft 44 that is rotatable relative to the top enclosure 12 and bottom enclosure 28. The shaft may have an elongate shape having a first end 46 and a second end 48 opposite the first end 46. The first end 46 may have a circular cross-section shape, and the diameter of the circular cross-sectional shape of the first end 46 may be slightly less than the diameter of the circular cross-sectional shape of the inner side surface 94 defining the interior bore portion 24 of the shaft protrusion 20 of the top enclosure 12. So configured, the first end 46 of the shaft is rotatably disposed within the enclosed interior bore portion 24. The shaft 44 may have a first intermediate portion 50 disposed between the first end 46 and the second end 48 of the shaft 44. The first intermediate portion 50 may have a circular cross-section shape, and the diameter of the circular cross-sectional shape of the first intermediate portion 50 is slightly less than the diameter of the circular cross-sectional shape of the shaft aperture 28 such that the first intermediate portion 50 extends through, and is rotatably disposed within, the shaft aperture 28. So configured, the second end 48 of the shaft is disposed exterior to the interior volume 38 formed by the top enclosure 12 and the bottom enclosure 28. For example, the second end 48 of the shaft 44 may extend beyond the lower boss portion 126 that projects downwardly from the base wall 30 of the bottom enclosure 28. The shaft 44 may have any suitable shape or combination of shapes. For example, the shaft 44 may have a substantially cylindrical shape having a substantially uniform cross-section shape.

As illustrated in FIGS. 3 and 6, the shaft 44 may be maintained in a desired position by a pair of snap rings 130 disposed in grooves formed in the first intermediate portion 50 of the shaft 44. One of the pair of snap rings 130 may be disposed adjacent to or contacting a distal end of the upper boss portion 122 and a second of the pair of snap rings 130 may be disposed adjacent to or contacting a distal end of the lower boss portion 126, thereby preventing upward and/or downward displacement of the shaft 44 relative to the bottom enclosure 28. A seal 132, such as an O-ring, may be disposed in a recess that extends around the circumference of the first intermediate portion 50 of the shaft 44. The seal 132 is adapted to sealingly engage the inner surfaces 120, 124 that define the shaft aperture 28 to prevent a leakpath between the first intermediate portion 50 of the shaft 44 and the inner surfaces 120, 124. The seal 132 may be made from a radiation tolerant, high temperature silicone material.

Figure 7A:
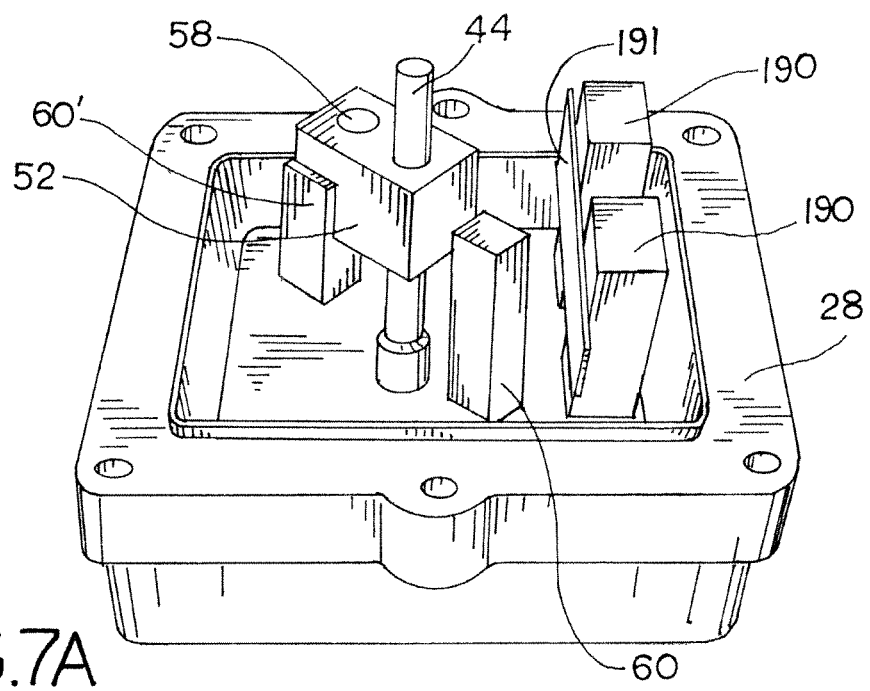
FIG. 7A is a perspective view of the embodiment of the enclosed proximity switch assembly of FIG. 1 with the top enclosure removed for clarity.

As illustrated in FIGS. 3, 7A and 7B, the enclosed proximity switch assembly 10 may also include a target support 52. The target support 52 may include a base portion 134 that is coupled to a second intermediate portion 54 of the shaft 44, with the second intermediate portion 54 being disposed between the first end 46 and the first intermediate portion 50 of the shaft 44. More specifically, the base portion 134 may have an aperture 136 extending from a top portion to a bottom portion of the base portion 134, and the aperture 136 receives the second intermediate portion 54 of the shaft 44. The base portion 134 may be fixed to the shaft 44 such that the target support 52 rotates along with the shaft 44, and the base portion 134 may be prevented from rotating relative to the shaft 44 by any means known in the art, such as, for example, a set screw, a key and slot, or an interference fit. In addition, one or more snap rings (not shown) may be coupled to the shaft 44 adjacent to the bottom portion of the base portion 134 to prevent downward displacement of the target support 52. The base portion 134 may be permanently fixed to the shaft, of the base portion 134 may be releasably secured to the such that the base portion 134 can be vertically repositioned relative to the shaft 44. The base portion 134 have any suitable shape or combination of shapes. For example, the base portion 134 may have a circular or ovular cross-sectional shape, or the base portion 134 may have a polygonal cross-sectional shape, such as that of a square or rectangle. The base portion 134 may be dimensioned such that when the target support 52 rotates with the shaft 44, the base portion 134 does not contact any of the elements contained within the interior volume, such as the one or more proximity switches 60.

Referring again to FIGS. 3, 7A and 7B, the target support 52 may also include a radial portion 56 coupled to the base portion 134 such that the radial portion 56 extends away from the shaft 44. The radial portion 56 may have any shape or combination of shapes suitable for a given application. For example, the radial portion 56 may be a cantilevered projection extending from the base portion 134, and the radial portion 56 may have a rectangular cross-sectional shape. If the target support 52 includes more than one radial portions 56 are used, each radial portion may be a cantilevered projection extending from the base portion 134. Each radial portion 56 may include a target aperture 138 extending therethrough, and a longitudinal axis of the target aperture 138 may be substantially vertical. The target aperture 138 may be sized to receive a target magnet 58. The target magnet 58 may have any shape or size suitable for a particular application. For example, the target magnet 58 may have a cylindrical shape, and the depth of the cylinder may be less than the vertical height of the radial portion 56 such that the target magnet 58 may be vertically adjusted within the target aperture 138. The target magnet 58 may be secured within the target aperture 138 by any means known in the art, such as by an adhesive, or by a magnetic force. In addition, the target aperture 138 may be a blind bore having a bottom portion of a reduced thickness to support the target magnet 58. The target aperture 138, and the target magnet 58 disposed therein, may be positioned at any suitable location on the radial portion 56. For example, the target aperture 138 may be disposed on the radial portion 56 such that when the radial portion 56 is rotated to a position above a proximity switch 60, at least a portion of the target magnet 58 is disposed above or adjacent to a top portion 64 of a proximity switch 60. However, the target aperture 138 may be disposed at any location on the radial portion 56 that allows the target magnet 58 to be detected by the proximity switch 60 in a manner that will be described in more detail below. The target magnet 58 may be any type of magnet suitable for a particular application, such as a samarium cobalt magnet.

An alternative embodiment of the target support 52 is illustrated in FIGS. 12A and 12B. In this embodiment, the target support 52 includes a magnet support 200, a hub 202, and a clamp plate 204. The hub 202, illustrated in FIG. 13A, may include a body portion 206 that extends along a longitudinal axis 207 from a first end 208 to a second end 210. The body portion 206 may also have a shaft aperture 209 that extends along the longitudinal axis 207 from the first end 208 of the body portion 206 to the second end 210 body portion 206, and the shaft aperture 210 may sized to receive the second intermediate portion 54 of the shaft 44. The body portion 206 may be elongated and may have a cylindrical outer surface 212 that is coaxially aligned with the longitudinal axis 207 of the body portion 206. However, the outer surface 212 of the body portion 206 may have any suitable shape, such as the shape of a polygon or an oval when viewed in cross-section along the longitudinal axis 207 of the body portion 206. One or more body apertures 213 may extend in a radial direction (i.e., normal to and intersecting the longitudinal axis 207) from the outer surface 212 of the body portion 206 to the shaft aperture 210. For example, as illustrated in FIG. 13A, the body portion 206 may include four body apertures, with a first and second body aperture 213a, 213b being longitudinally aligned and offset by a suitable longitudinal distance. A third body aperture 213c may be radially aligned with the first body aperture 213a such that a longitudinal axis of the third body aperture 213c is coaxially aligned with a longitudinal axis of the first body aperture 213a, and the longitudinal axis of each of the first body aperture 213a and the third body aperture 213c intersects the longitudinal axis 107. A fourth body aperture 213d may be radially aligned with the second body aperture 213b such that a longitudinal axis of the fourth body aperture 213d is coaxially aligned with a longitudinal axis of the second body aperture 213b, and the longitudinal axis of each of the fourth body aperture 213d and the second body aperture 213b intersects the longitudinal axis 107. Each of the body apertures 213 may be internally threaded and dimensioned to receive and threadedly engage a corresponding set screw 220 that will be described in more detail below.

As illustrated in FIG. 13A, the hub 202 of the target support 52 may also include a flange portion 214 that radially extends from the first end 208 of the body portion 206. More specifically, the flange portion 214 may include top surface 215 that may be planar and may be normal to the longitudinal axis 207. The top surface 215 may have a circular perimeter edge 216, and the diameter of the perimeter edge 216 may be greater than the diameter of the outer surface 212 of the body portion 206. A flange surface 218 may downwardly (i.e., towards the second end 210 of the body portion 206) extend from the perimeter edge 216 or from a cylindrical side surface 222 that downwardly extends from the perimeter edge 216, and the flange surface 218 may gradually taper to intersect the outer surface 212 of the body portion 206 such that the flange surface 218 has a frusto-conical shape. One or more flange apertures 224 may inwardly extend from the top surface 215 of the flange portion 214 in a direction parallel to the longitudinal axis 207. For example, three flange apertures 224 may be symmetrically disposed about the longitudinal axis 207. Each flange aperture 224 may be internally threaded and dimensioned to receive and threadedly engage a corresponding top screw 226 that will be described in more detail below.

Referring to FIGS. 12A and 12B, the target support 52 may also include the magnet support 200 that is non-rotatably secured to (or integrally formed with) the hub 202. The magnet support 200 may include a base portion 228, and the base portion may extend in a direction normal to the longitudinal axis 207. The base portion 228 may have a disc-like shape such that base portion 228 has a planar top surface 230 and a planar bottom surface 232. The base portion 228 may also have a central aperture 234 that extends from the top surface 230 to the bottom surface 232. The central aperture 234 may have a cylindrical inner surface 238, and the longitudinal axis of the cylindrical inner surface 238 may be coaxially aligned with the longitudinal axis 107. The central aperture 234 may receive the body portion 206 of the hub 202, so the diameter of the inner surface 238 may be slightly greater than the diameter of the outer surface 212 of the body portion 206. The magnet support 200 may also include a side wall 236 that upwardly extends from the top surface 230 of the base portion 228 adjacent to a circumferential edge of the base portion 228, and the side wall 236 may be partially defined by an inner surface 238, and the inner surface 238 may have the shape of a cylinder that is coaxially aligned with the longitudinal axis 107.

To secure the hub 202 to the magnet support 200 as illustrated in FIG. 12A, the body portion 206 of the hub 202 may received into the central aperture 234 of the magnet support 200 such that the tapered flange surface 218 contacts a portion of the base portion 228 adjacent the top surface 230. So positioned, the second end 210 of the hub 202 extends below the bottom surface 232 of the base portion 228 of the magnet support 200 to form a shoulder. The hub 202 may then be secured to the magnet support 200 by any manner known in the art such that no relative rotation or relative longitudinal displacement occurs between the hub 202 and the magnet support 200 during use of the assembly 10. For example, the base portion 228 may be welded to the body portion 206 of the hub 202, or a snap ring (not shown) may be disposed in a circumferential groove formed in the body portion 206 immediately adjacent to the bottom surface 230 of the base portion 228 of the magnet support 200. In addition, an interference fit between the central aperture 234 of the base portion 228 and the outer surface 212 of the body portion 206 of the hub 202 may non-rotatably couple the magnet support 200 and the hub 202. In alternative embodiments, the hub 202 and the magnet support 200 may be integrally formed as a single, unitary part such that the body portion 206 of the hub 202 extends from the bottom surface 232 of the base portion 228 of the magnet support 200.

As illustrated in FIG. 12A, one or more target magnets 58 may be disposed on the top surface 230 of the base portion 228 of the magnet support 200. More specifically, the one or more target magnets 58 may each be disc-shaped, and the diameter of the disc may be slightly less than the radial distance between the perimeter edge 216 of the flange portion 214 of the hub 202 and the inner surface 238 of the side wall 236 of the magnet support 200. As such, each of the one or more target magnets 58 may be disposed at a desired location on the top surface 230 of the base portion 228 between the perimeter edge 216 of the flange portion 214 and the inner surface 238 of the side wall 236, and such a desired location may be any suitable location that allows the target magnet 58 to be detected by the proximity switch 60 in a manner that will be described in more detail below. An O-ring 250 may be disposed around the circumference of the flange portion 214 such that the O-ring 250 contacts at least a portion of the flange surface 218, a portion of the top surface 230 of the base portion 228, and a portion of the target magnet 58 to secure the target magnet 58 in a desired location when the target support 52 is assembled.

Referring to FIGS. 12A and 12B, the target support 52 may also include the clamp plate 204, and the clamp plate 204 may have a planar top surface 240, a planar bottom surface 242, and a shaft aperture 244 adapted to receive a portion of the shaft 44. The clamp plate 204 may have a circular perimeter edge 246 such that the clamp plate 204 has a disc-like shape and a longitudinal axis of the shaft aperture 244 is aligned with the center of the circular perimeter edge 246. The diameter of the perimeter edge 246 may be slightly less than the diameter of the inner surface 238 of the side wall 236 of the magnet support 200. The clamp plate 204 may include one or more clamp apertures 248 that may extend from the top surface 240 to the bottom surface 242 in a direction parallel to the longitudinal axis 207. The clamp apertures 248 may correspond in number, diameter, and relative position to the flange apertures 224 disposed in the flange portion 214 of the hub 202.

With the one or more target magnets 58 positioned as desired on the top surface 230 of the base portion 228 of the magnet support 200, the bottom surface 242 of the clamp plate 204 may be moved into contact with or immediately adjacent to the top surface 215 of the flange portion 214 of the hub 202 such that each of the clamp apertures 248 is aligned with a corresponding flange aperture 224 of the flange portion 214 of the hub 202 and such that the shaft aperture 244 of the clamp plate 204 is coaxially aligned with the shaft aperture 209 of the hub 202, as illustrated in FIG. 12A. A top screw 226 is inserted into each of the clamp apertures 248 and is rotated to threadedly engage the corresponding flange aperture 224 to secure the magnet support 200 to the clamp plate 204. Each of the top screws 226 may be torqued a minimum of 160 inch-ounces to ensure proper engagement. So configured, the bottom surface 242 of the clamp plate 204 may contact or may be immediately adjacent to a top surface of each of the one or more target magnets 58 to secure or further secure the target magnets 58 in a desired position.

To secure the target support 52 to the shaft 44, the shaft 44 is inserted into the shaft aperture 244 of the clamp plate 204 and the shaft aperture 209 of the hub 202 such that the longitudinal axis of the shaft 44 (and the longitudinal axis 42 of the interior bore portion 24 as illustrated in FIG. 3) is coaxially aligned with the longitudinal axis 207. The target support 52 is subsequently longitudinally positioned at a desired location that will be described in more detail below. A set screw 220 is inserted into each of the body apertures 213 formed in the body portion 206 of the hub 202 (such as the first, second, third, and fourth body apertures 213a, 213b, 213c, 213d). As illustrated in FIG. 13B, each set screw 220 is then rotated to threadedly engage the corresponding body aperture 213 until a distal end 251 of the set screw 220 contacts the outer surface 253 of the shaft 44. A minimum torque of 150 inch-ounces is applied to each set screw 220 to fully secure the hub 202 to the shaft 44. Each of the set screws 220 is sealed with a high-temperature potting to further secure the set screws 220 within the corresponding body aperture 213. The potting may be applied to the set screw and/or the body aperture 213 prior to inserting the set screw 220 within the body aperture 213. Alternatively, the potting may be applied after the set screw 220 is fully received within the body aperture. The potting may be an epoxy, such as DURALCO® 4525, for example. The potting may air dry or may be heated to dry. The minimum torque specification in conjunction with the potting assist in maintaining the set screws 220 in engagement with the shaft 44 (and thereby preventing longitudinal displacement of the target support 52 relative to the shaft 44) when the enclosed proximity switch assembly 10 is subjected to seismic testing or any other seismic event. One having ordinary skill in the art would recognize that the minimum torque specification in conjunction with the described potting can also be employed with any embodiment of a target support. For example, referring to the target support 52 illustrated in FIGS. 7A and 7B, one or more body apertures would each extend from an outer surface of the base (or body) portion 134 to the aperture 136 to receive a set screw 220.

Figure 14:
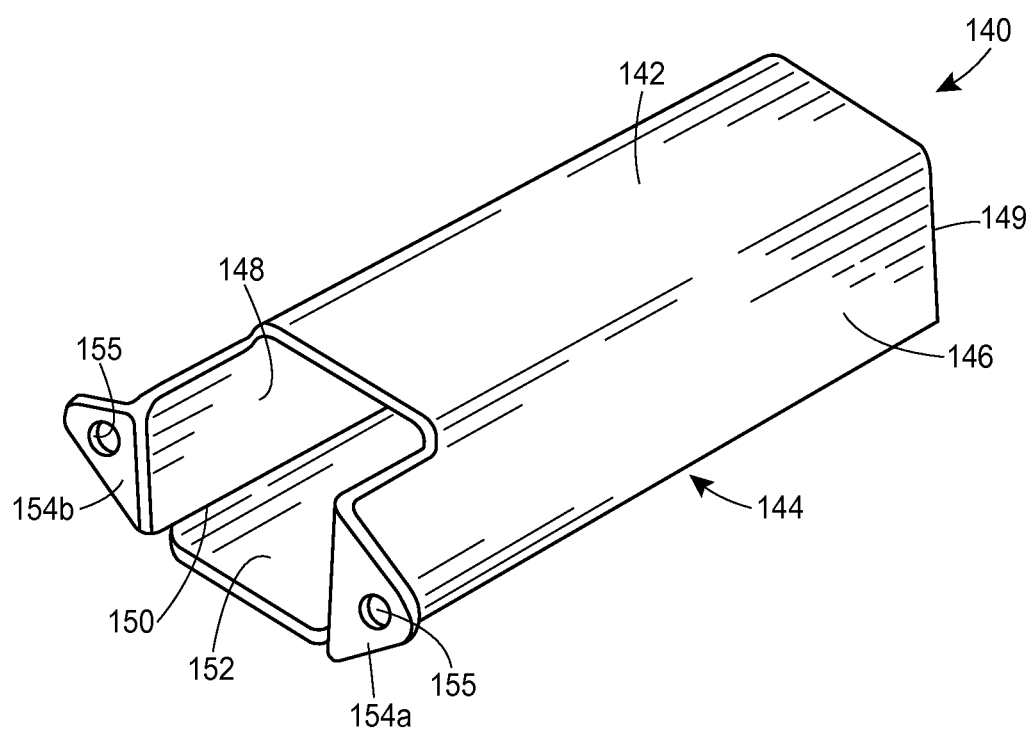
FIG. 14 is a perspective view of an embodiment of a housing of a proximity switch.

As illustrated in FIGS. 3, 7A, 8, and 9, the enclosed proximity switch assembly 10 may also include one or more proximity switches 60 coupled to the bottom enclosure 28. The proximity switch 60 may include a housing 140 having any suitable shape for a given application. For example, the housing 140 may include a planar first side wall 142 and a planar second side wall 144 parallel to and offset from the first side wall 142. A planar third side wall 146 may extend perpendicularly between the first side wall 142 and the second side wall 144 along a first lateral edge of the first side wall 142, and a planar fourth 148 side wall may extend perpendicularly between the first side wall 142 and the second side wall 144 along a second lateral edge of the first side wall 142. A planar end wall 149 may perpendicularly intersect the first side wall 142, the second side wall 144, the third side wall 146, and the fourth side wall 148, and the planar end wall 149 may comprise the top portion 64 of the proximity switch 60. An open end 150 may provide access to an interior volume 152 of the housing 140. A pair of mounting flanges 154a, 154b may be secured to, or formed integrally with, the housing 140 adjacent to the open end 150, and the mounting flanges 154a, 154b may each have an aperture 155 that is adapted to receive a bolt that secures the housing 140 of the proximity switch 60 to a suitable portion of the bottom enclosure 28. The housing 140 may be made from a copper material and the pair of mounting flanges 154a, 154b may be made from a brass material, and each of the pair of mounting flanges 154a, 154b may be soldered or otherwise secured to the third side wall 146 and the fourth side wall 148, respectively. If the pair of mounting flanges 154a, 154b is integrally formed with the housing 140, as illustrated in FIG. 14, then a first mounting flange 154a may be integrally formed with the third side wall 146 and a second mounting flange 154b may be integrally formed with the fourth side wall 148. The body 140 having integrally formed mounting flanges 154a, 154b may be made from a single piece of material (such as stainless steel) that is stamped and bent in one or more secondary operations. Because only a single piece of material is used, and because no secondary bonding operations (such as soldering) are required to secure the mounting flanges 154a, 154b to the body 140, a housing 140 formed from a single piece of material reduces both material costs and manufacturing costs. In addition, such integrally formed mounting flanges 154a, 154b do not separate from the body 140 during seismic testing or other seismic events, thereby maintaining the proximity switch 60 in it proper position.

Referring to FIGS. 8 and 9, the proximity switch 60 may include a switch assembly 156 that is disposed within the interior volume 152 of the housing 140. The switch assembly may include a base 158, and the base may include a fulcrum 160 formed on a first portion of the base. A lever 162 may be pivotably coupled to the fulcrum 160 by a hinge pin 164. A driver magnet 166 may be disposed within a cavity 168 formed in the base 156, and the driver magnet 166 may have a substantially rectangular cross-sectional shape. The driver magnet 166 may have a height, width, and depth that closely correspond to the height, width, and depth of the cavity 168 such that the elongated driver magnet 166 can be received into the cavity 168 such that a longitudinal axis of the driver magnet 166 is parallel to a longitudinal axis of the base 156. A lip 170 may extend along a pair of oppositely disposed lateral edges to maintain the driver magnet 166 in a desired position within the cavity 168. So configured, the longitudinal axis of the driver magnet may be parallel to a longitudinal axis of the lever 162 when the lever is balanced about the hinge pin 164. The driver magnet 166 may be made from any suitable magnetic material or combination of materials. For example, the driver magnet 166 may be a samarium cobalt magnet.

The switch assembly 156 may also include an end cap 180 having a plurality of pins 182 that outwardly extend through the end cap 180. Each of the pins 182 may be electrically connected to contacts in the switch assembly 156 in a manner which will be described in more detail below. The end cap 180 may be secured to an end portion of the base 156 such that when the switch assembly 156 is disposed within the housing 140, each of the plurality of pins 182 is substantially parallel to the longitudinal axis of the housing 140 and a distal portion of each of the plurality of pins 182 projects out of the open end 150 of the housing 140. The end cap 180 may also include a mounting shaft 184 that is rigidly coupled to the end cap 180 and that extends parallel to the longitudinal axis of the housing.

As illustrated in FIG. 8, the proximity switch 60 may also include a shield 172 disposed within the interior volume 152 of the housing 140. The shield 172 may include a first wall 174 and a pair of parallel lateral walls 176, 178 that each extend form opposing lateral edges of the first wall 174 such that the walls 174, 176, 178 defining a channel to receive and protect the switch assembly 156 within the interior volume 152 of the housing 140.

The switch assembly 156 of the proximity switch 60 may include dry contacts (i.e., contacts that are not initially connected to a voltage source), such as form C dry contacts. For example, as illustrated in FIG. 11A, when the shaft 44 is in a first shaft position 61 in which the target magnet 58 is outside of a predetermined range (illustrated by the dashed area 196) of the top portion 64 of the proximity switch 60, the driver magnet 166 may exert a magnetic force on the lever 162 (or an element coupled to the lever 162) of suitable strength to maintain the lever 162 in a first position in which the lever 162 electrically couples a "normally closed" contact N/C with a common contact C (schematically illustrated in FIG. 10A), with each of the normally closed contact N/C and the common contact C being electrically coupled to a corresponding pin 182 extending through the end cap 180. When the common contact C is electrically coupled to the normally closed contact N/C, the proximity switch 60 is in a first state 66.

The shaft 44 may be rotated from the first shaft position 61 to a second shaft position 63, illustrated in FIG. 11B, in which the target magnet 58 is within a predetermined range 196 of the top portion 64 of the proximity switch 60. In this second shaft position 63, the magnetic force between the lever 162 (or an element coupled to the lever) and the target magnet 58 becomes stronger than the magnetic force between the lever 162 (or an element coupled to the lever) and the driver magnet 166. The stronger force between the target magnet 58 and the lever 162 (or an element coupled to the lever) thereby causes the lever 162 to pivot about the hinge pin 164 from the first position to a second position (shown schematically in FIG. 10B) in which the lever 162 electrically couples a "normally open" contact N/O with the common contact C, with the normally open contact N/O being electrically coupled to a corresponding pin 182 extending through the end cap 180. With the lever 162 in this second position, the proximity switch 60 is in a second state 70. The proximity switch 60 may be maintained in the second state 70 as long as the target magnet 58 is within a predetermined range of the top portion 64. However, when the target magnet 58 moves outside of the predetermined range, the proximity switch 60 changes bias from the second state 70 to the first state 66.

As described above, the proximity switch 60 changes bias from a first state 66 to a second state 70 when the target magnet 58 is within a predetermined range 196 of the top portion 64 of the proximity switch 60. The predetermined range 196 may be defined by the size of the magnetic field generated by the driver magnet 166, the target magnet 58 may be within the predetermined range 196 when any portion of the magnetic field generated by the target magnet 58 intersects any portion of the magnetic field generated by the driver magnet 166. Similarly, the target magnet 58 may be outside the predetermined range 196 when no portion of the magnetic field generated by the target magnet 58 intersects a portion of the magnetic field generated by the driver magnet 166. One having ordinary skill in the art would recognize that the predetermined range 196 can have a variety of sizes and shapes, and several factors may contribute to the size and shape of the predetermined range 196, such as the relative size, thickness, and/or strength of the driver magnet 166 and the target magnet 58, as well as the vertical distance separating the driver magnet 166 and the target magnet 58, for example. By changing one of more of these variables, the size of the predetermined range 196 may be adjusted to a desired size. For example, the target magnet may 58 may be within the predetermined range 196 when any portion of the target magnet 58 intersects any portion of the top portion 64 of the proximity switch 60 when viewed along the longitudinal axis of the shaft 44 from a point above the target support 52. One having ordinary skill in the art would also recognize that instead of the single pole, double throw configuration described above, other configurations are also possible, such as, for example, a double pole, double throw configuration.

As briefly explained above, both the driver magnet 166 and the target magnet 58 may be samarium cobalt magnets.

Samarium cobalt magnets offer a relatively large strength to area ratio compared to conventional magnets. Such a high strength to area ratio helps achieve increased contact pressure and a more positive snap action when the proximity switch changes bias as described above.

The proximity switch 60 may be coupled to the bottom enclosure 28 in any suitable manner. For example, as illustrated in FIG. 3, a planar support plate 186 may be disposed on the base wall 30 of the bottom enclosure 28, and the support plate 186 may be coupled to the base wall 30 by any means known in the art, such as by the use of adhesives or mechanical couplings. The support plate 186 may have pre-formed apertures 188 that are adapted to receive the mounting shaft 184 and the bolts that extend through the apertures of the mounting flanges 154a, 154b to secure the housing 140 of the proximity switch 60 to the support plate 186. The apertures 188 may be disposed at any desirable locations in the support plate 186, such as, for example, locations that allow the target magnet 58 to be disposed adjacent to the top portion 64 of the proximity switch 60.

As previously explained, the enclosed proximity switch assembly 10 may include more than one proximity switch 60. For example, as illustrated in FIG. 3, a second proximity switch 60' may also be mounted to the support plate 186, and the second proximity switch 60' may be identical to the first proximity switch 60 described above. The second proximity switch 60' may be disposed at any desired location on the support plate 186 (or any other portion) of the bottom enclosure 28. For example, the first proximity switch 60 may be disposed such that the longitudinal axes of the housing 140 is parallel to the longitudinal axis of the shaft 44, and the longitudinal axis of the housing 140 is offset from the longitudinal axis of the shaft 44 by a first distance. The second proximity switch 60' may be disposed such that the longitudinal axes of the housing 140' is parallel to the longitudinal axis of the shaft 44, and the longitudinal axis of the housing 140 is offset from the longitudinal axis of the shaft 44 by a distance that is substantially equal to the first distance. The first proximity switch 60 and the second proximity switch 60' may be symmetrically disposed about the shaft 44 such that a horizontal reference line may pass through the longitudinal axes of the shaft 44, the first proximity switch 60, and the second proximity switch 60'. Said another way, when viewed along the longitudinal axis of the shaft 44, the angle between a first horizontal line segment extending from the longitudinal axis of the shaft 44 to the longitudinal axis of the first proximity switch 60 and a second horizontal line segment extending from the longitudinal axis of the shaft 44 to the longitudinal axis of the second proximity switch 60' is approximately 180°.

If three proximity switches are used, the three proximity switches may also be symmetrically disposed about the shaft 44. For example, the angle between a first horizontal line segment extending from the longitudinal axis of the shaft 44 to the longitudinal axis of the first proximity switch 60 and a second horizontal line segment extending from the longitudinal axis of the shaft 44 to the longitudinal axis of the second proximity switch 60' is approximately 120°. In addition, the angle between the second horizontal line segment extending from the longitudinal axis of the shaft 44 to the longitudinal axis of the second proximity switch 60' and a third horizontal line segment extending from the longitudinal axis of the shaft 44 to the longitudinal axis of the third proximity switch 60" is approximately 120°.

As illustrated in FIG. 7A, the enclosed proximity switch assembly 10 may include one or more terminal strips 190. The one or more terminal strips 190 may be coupled to the support plate 186 at any suitable location such that the one or more terminal strips 190 does not interfere with the rotation of the target support 52 about the shaft 44. The one or more terminal strips 190 may be directly coupled to the support plate 186 or may be coupled to a coupling element that is secured to the support plate 186 or any portion of the bottom enclosure 28, such as an upright bracket 191. The terminal strip 190 may have a ceramic insulator base using tubular shaped standoffs that mounting fasteners may pass through. This arrangement provides an air gap between a mounting surface and the terminal strip 190, thereby reducing heat transfer between the terminal strip 190 and the mounting surface.

Each terminal strip 190 may be adapted to each receive one or more wires (not shown) that are electrically coupled to any of the plurality of pins 182 of the proximity switch 60. The terminal strips 190 may also be adapted to receive one or more wires that may extend through the side aperture 128 of the bottom enclosure 28, and these wires that extend through the side aperture 128 may be adapted to be connected to one or more external devices, such as a controller or a diagnostic device. The terminal strip 190 operates to electrically couple one of the wires coupled to a pin 182 of the proximity switch 60 to a wire that extends through the side aperture 128 in a manner known in the art. Instead of, or in addition to, the arrangement described above, any arrangement or combinations or wires may be interconnected through the terminal strip 190. For example a wire providing power may be interconnected to a wire that is electrically coupled to a pin 182 of the proximity switch 60. Any suitable terminal strip 190 may be included in the enclosed proximity switch assembly 10. For example, the terminal strip 190 may be radiation tolerant, high temperature terminal strip. Such a terminal strip 190 may be made from Ryton or a similar material. The terminal strip 190 may also include metallic internal components to resist corrosion. A transmission device (not shown) may be coupled to the one or more terminal strips 190, and such a transmission device may communicate wirelessly one or more external devices, such as a controller, to indicate the state of the one or more proximity switches 60 to determine the position of the valve element of the control valve.

In operation, the enclosed proximity switch assembly 10 may be coupled to a valve element (not shown), such as the rotating stem of a control valve used for a nuclear application. The enclosed proximity switch assembly 10 may be coupled to the valve element by any means known in the art, such as by a collar or other type of adapter. In addition, the bottom enclosure 28 may be coupled to a portion of the valve by, for example, bolts that extend into apertures 194 disposed on a bottom surface of the bottom enclosure 28. The enclosed proximity switch assembly 10 may be calibrated such that when the valve is in a first position, the shaft 44 is in the first shaft position 61 in which the target magnet 58 is outside of a predetermined range of the top portion 64 of the proximity switch 60 such that the proximity switch 60 is in the first state 66. However, when the valve is in a second position, the shaft 44 is rotated into a second shaft position 63 in which the target magnet 58 is within a predetermined range of the top portion 64 of the proximity switch 60 such that the proximity switch 60 moves to a second state 70. As explained previously, the proximity switch 60 is maintained in the second state 70 as long as the target magnet 58 is within the predetermined range of the top portion 64. When the target magnet 58 is moved outside of the predetermined range, the proximity switch 60 changes bias from the second state 70 to the first state 66. One having ordinary skill in the art would recognize that the shaft 44 could be maintained in the second shaft position 63 in which the target magnet 58 is within a predetermined range of the top portion 64 of the proximity switch 60 such that the proximity switch 60 is in a second state 70, and the shaft 44 could be rotated into the first shaft position 61, thereby causing the proximity switch to move to the first state 66, when the control element coupled to the shaft 44 is rotated or otherwise displaced. In this configuration, one having ordinary skill in the art would recognize that the normally open contact and normally closed contact illustrated in FIGS. 10A and 10B would switch roles.

If additional proximity switches 60 are used, the target magnet 58 (or an additional target magnet coupled to the target support 52) may change the bias of the additional proximity switch 60 from the first state 66 to the second state 70 (and vice versa) as explained above. A controller (or other device) that is connected to the wires that are connected to the terminal strips 190 may indicate the state of the one or more proximity switches 60 to determine the position of the valve element of the control valve.

Additional features may be incorporated into the enclosed proximity switch assembly 10, such as a magnetic interlock indicator (not shown) disposed on the outside of the top enclosure 12 or bottom enclosure 28. The magnetic interlock indicator may indicate whether the proximity switch 60 is in the first state 66 or the second state 70. The magnetic interlock indicator may have a machined post design using a knob in the top enclosure 12 or the magnetic interlock indicator may include a frictionless magnetic float driven by the magnetic pull of the target magnet. The enclosed proximity switch assembly 10 may also include an attached solenoid valve.

The embodiments of the enclosed proximity switch assembly 10 described above provide a contained environment for use in hazardous environments, such as nuclear applications. More specifically, the enclosed proximity switch assembly 10 is intended to withstand temperatures and pressures that occur during a containment accident or a LOCA (loss of coolant accident) at a nuclear facility, and the enclosed proximity switch assembly 10 may be an explosion-proof enclosure. This level of protection is due in part to the elimination of potential leakpaths through the top enclosure 12 due to a shaft aperture (or other point of ingress) because the interior bore portion 24 of the shaft protrusion 20 is an enclosed volume that is not in fluid communication with the exterior of the top enclosure 12. Other leakpaths are prevented by seals, such as seals 116, 132, which may be fabricated from a radiation tolerant, high temperature silicone material. The wires that extend from the terminal strips 190 (or directly from the one or more proximity switches 60) through the side aperture 128 of the bottom enclosure 28 may be protected by a radiation resistant conduit (not shown) that may be sealingly coupled to the side aperture to further prevent potential leakpaths.

The enclosed proximity switch assembly 10 described above also provides a modular design that allows the number of and layout of proximity switches 60, as well as other components, to be changed for a desired application, thereby reducing the cost associated with replacing an entire assembly when a configuration is to be modified. In addition, one having ordinary skill in the art would recognize that a nuclear junction box is not necessary with the enclosed proximity switch assembly 10, and the enclosed proximity switch assembly 10 requires less piping than conventional switch enclosures, which both further reduce costs and require less labor to install.

While various embodiments have been described above, this disclosure is not intended to be limited thereto. Variations can be made to the disclosed embodiments that are still within the scope of the appended claims.

What is claimed is:

1. A method of non-rotatably securing a target support to a shaft that extends along a longitudinal axis within an enclosed proximity switch assembly, the target support including one or more target magnets and including a cylindrical target aperture, wherein the target support includes a hub having a body portion that extends along the longitudinal axis, the body portion including an outer surface and a shaft aperture that extends along the longitudinal axis, wherein the body portion further includes one or more threaded body apertures that extend from the outer surface to the shaft aperture, the method comprising:
   inserting the one or more target magnets into the cylindrical target aperture; inserting the shaft
   into the shaft aperture of the body portion along the longitudinal axis;
   inserting a set screw into one of the one or more body apertures, the set screw including a head portion and a threaded portion having a contact surface disposed at a furthest distance from the head portion;
   applying a torque to the set screw to threadably engage the set screw with the one of the one or more body apertures such that the contact surface of the threaded portion of the set screw contacts an outer surface of the shaft; and
   sealing the set screw within the one of the one or more body apertures with a high-temperature potting.

2. The method of claim 1, further comprising non-rotatably securing a magnet support to the hub, and providing the magnet support with a base portion that extends in a direction normal to the longitudinal axis, the base portion including a planar top surface, the magnet support further including a side wall that upwardly extends from the top surface of the base portion, the side wall being partially defined by an inner surface.

3. The method of claim 2, further comprising disposing the one or more target magnets on the top surface of the base portion of the magnet support between a portion of the hub and the inner surface of the side wall of the magnet support.

4. The method of claim 3, further comprising providing the target support with a clamp plate having a planar bottom surface and a shaft aperture adapted to receive a portion of the shaft, the clamp plate being secured to the hub such that the bottom surface of the clamp plate is immediately adjacent to or in contact with a top surface of the hub and such that the bottom surface of the clamp plate is also immediately adjacent to or in contact with a top surface of the one or more target magnets.

5. The method of claim 2, further comprising integrally forming the hub and the magnet support as a single, unitary part.

6. The method of claim 2, further comprising receiving the body portion of the hub into a central aperture formed in the base portion of the magnet support.

7. The method of claim 1, wherein the one or more body apertures extend normal to the longitudinal axis.

8. The method of claim 1, wherein the high-temperature potting is an epoxy.

9. The method of claim 1, wherein applying a torque to the set screw comprises applying a minimum torque of 150 inch-ounces to the set screw.

* * * * *

UNITED STATES PATENT AND TRADEMARK OFFICE
CERTIFICATE OF CORRECTION

PATENT NO. : 10,003,333 B2
APPLICATION NO. : 14/495721
DATED : June 19, 2018
INVENTOR(S) : Robert L. LaFountain et al.

It is certified that error appears in the above-identified patent and that said Letters Patent is hereby corrected as shown below:

In the Specification

At Column 1, Line 11, "Assembly,"" should be -- Assembly," now Pat. No. 8,866,571, --.

At Column 3, Line 10, "an side" should be -- a side --.

At Column 6, Line 45, "shaft aperture 38" should be -- shaft aperture 36 --.

At Column 6, Line 58, "shaft aperture 28" should be -- shaft aperture 36 --.

At Column 6, Line 63, "shaft aperture 28." should be -- shaft aperture 36. --.

At Column 7, Line 59, "shaft aperture 28" should be -- shaft aperture 36 --.

At Column 7, Line 61, "shaft aperture 28." should be -- shaft aperture 36. --.

At Column 8, Line 17, "shaft aperture 28" should be -- shaft aperture 36 --.

At Column 8, Line 41, "to the such that" should be -- to the shaft 44 such that --.

At Column 9, Line 32, "shaft aperture 210 may sized" should be -- shaft aperture 209 may be sized --.

At Column 9, Line 43, "shaft aperture 210." should be -- shaft aperture 209. --.

At Column 10, Line 47, "may received" should be -- may be received --.

At Column 13, Line 21, "base 156," should be -- base 158, --.

At Column 13, Line 28, "base 156." should be -- base 158. --.

Signed and Sealed this
Fifth Day of April, 2022

Drew Hirshfeld
*Performing the Functions and Duties of the*
*Under Secretary of Commerce for Intellectual Property and*
*Director of the United States Patent and Trademark Office*

At Column 13, Lines 42-43, "base 156" should be -- base 158 --.

In the Claims

At Column 18, Line 18, delete "inserting the shaft" and insert the same at Line 20 before "into the shaft" as a new sub-point.